(12) United States Patent
Matsukawa et al.

(10) Patent No.: US 9,025,309 B2
(45) Date of Patent: May 5, 2015

(54) CAPACITOR ARRAY AND SIGNAL PROCESSOR INCLUDING THE ARRAY

(71) Applicant: Panasonic Corporation, Osaka (JP)

(72) Inventors: Kazuo Matsukawa, Osaka (JP); Shiro Sakiyama, Kyoto (JP); Naoshi Yanagisawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 79 days.

(21) Appl. No.: 13/800,800

(22) Filed: Mar. 13, 2013

(65) Prior Publication Data
US 2013/0194719 A1    Aug. 1, 2013

Related U.S. Application Data

(63) Continuation of application No. PCT/JP2011/002735, filed on May 17, 2011.

(30) Foreign Application Priority Data

Oct. 26, 2010    (JP) .................................. 2010-239754

(51) Int. Cl.
*H01G 4/005*    (2006.01)
*H01G 4/38*    (2006.01)
(Continued)

(52) U.S. Cl.
CPC ............ *H01G 4/385* (2013.01); *H01L 23/5223* (2013.01); *H01L 27/0805* (2013.01); *H01L 2924/0002* (2013.01)

(58) Field of Classification Search
CPC ........................... H01G 4/385; H01L 23/5223

USPC .......................... 361/303, 330; 257/307, 308
See application file for complete search history.

(56) References Cited

U.S. PATENT DOCUMENTS

| 6,653,681 B2 * | 11/2003 | Appel .......................... 257/307 |
| 7,022,581 B2 | 4/2006 | Harris et al. |
| 2003/0183884 A1 | 10/2003 | Miyazawa |

(Continued)

FOREIGN PATENT DOCUMENTS

| CN | 1779966 A | 5/2006 |
| JP | 01079732 A * | 3/1989 |

(Continued)

OTHER PUBLICATIONS

International Search Report issued in International Patent Application No. PCT/JP2011/002735 mailed on Aug. 16, 2011.

(Continued)

*Primary Examiner* — David M Sinclair
(74) *Attorney, Agent, or Firm* — McDermott Will & Emery LLP

(57) ABSTRACT

A capacitor array includes a plurality of comb capacitors sharing a common comb electrode. At least one of the comb capacitors has a comb electrode as a single base part. Each of the other ones of the comb capacitors has an electrode formed by coupling a plurality of base parts. In the other ones of the comb capacitors, a space between a wire coupling the base parts and an end of each of comb teeth of the common electrode, which is interposed between the base parts, is larger than a space between a base of each of the base parts of the plurality of comb capacitors and an end of each of the comb teeth of the common electrode, which is interposed between comb teeth of the base part.

3 Claims, 7 Drawing Sheets

(51) Int. Cl.
*H01L 23/522* (2006.01)
*H01L 27/08* (2006.01)

(56) References Cited

U.S. PATENT DOCUMENTS

| | | |
|---|---|---|
| 2005/0064657 A1 | 3/2005 | Miyazawa |
| 2005/0145987 A1 | 7/2005 | Okuda et al. |
| 2006/0081904 A1* | 4/2006 | Cheah ............................ 257/307 |
| 2006/0086965 A1 | 4/2006 | Sakaguchi et al. |
| 2006/0270145 A1 | 11/2006 | Bach |
| 2007/0040633 A1* | 2/2007 | Yoshimoto .................... 333/193 |
| 2007/0278551 A1 | 12/2007 | Anthony |
| 2007/0296059 A1 | 12/2007 | Okuda et al. |
| 2008/0001255 A1 | 1/2008 | Okuda et al. |
| 2008/0265339 A1 | 10/2008 | Komatsu |
| 2008/0304205 A1* | 12/2008 | Bang ............................ 361/328 |
| 2008/0315275 A1* | 12/2008 | Liu ............................... 257/308 |
| 2009/0109597 A1 | 4/2009 | Anthony |

FOREIGN PATENT DOCUMENTS

| | | | |
|---|---|---|---|
| JP | 03-133169 A | | 6/1991 |
| JP | 03-133169 A | | 6/1991 |
| JP | 05153518 A | * | 6/1993 |
| JP | 07-169911 A | | 7/1995 |
| JP | 2003-297926 A | | 10/2003 |
| JP | 2005-197396 A | | 7/2005 |
| JP | 2008-226998 A | | 9/2008 |
| JP | 2009-540541 A | | 11/2009 |

OTHER PUBLICATIONS

English translation of CN Search Report issued in Chinese Application No. 201180051474.3 dated Jul. 31, 2014.

* cited by examiner

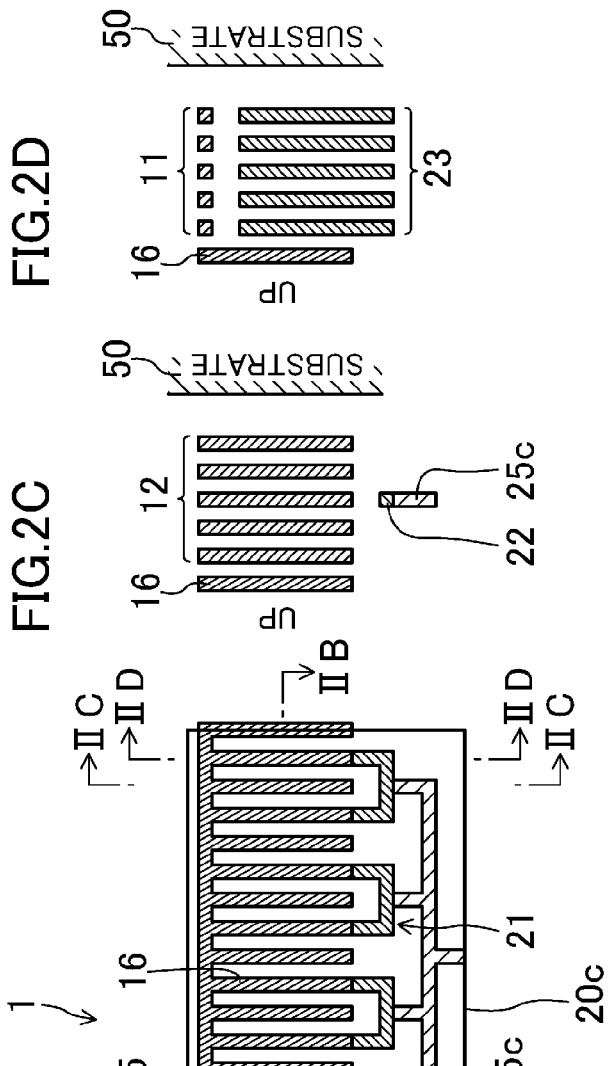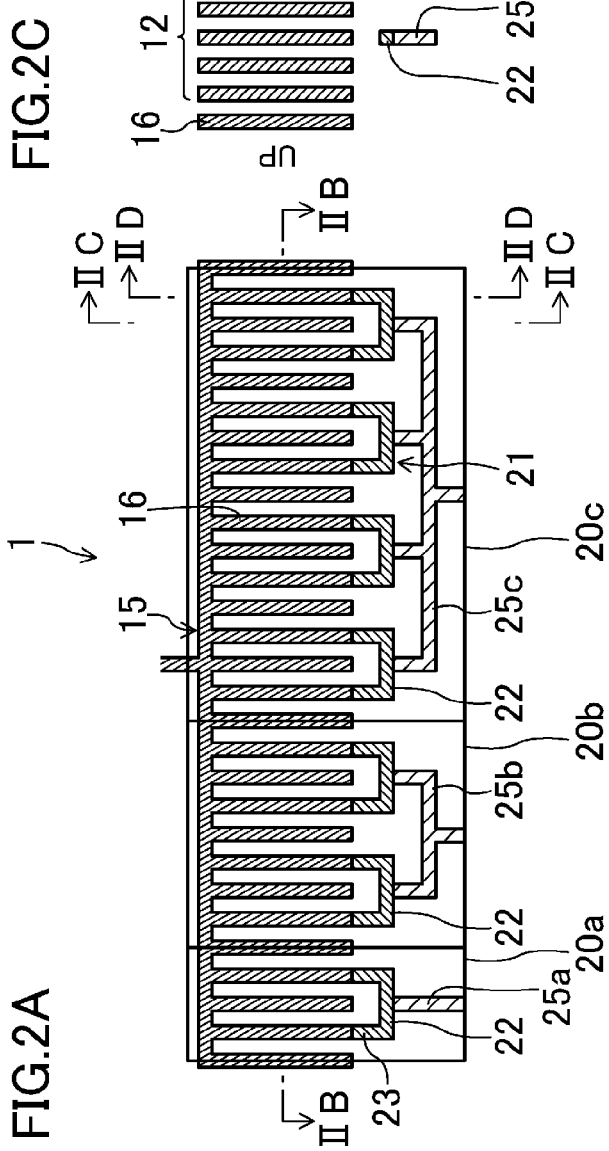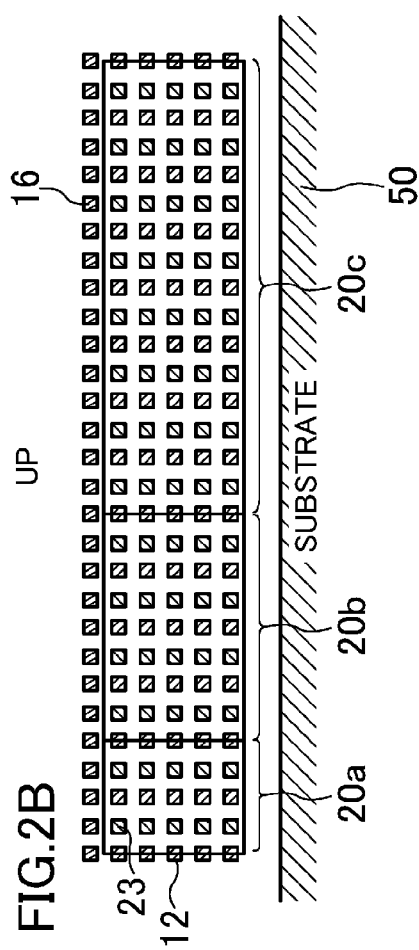

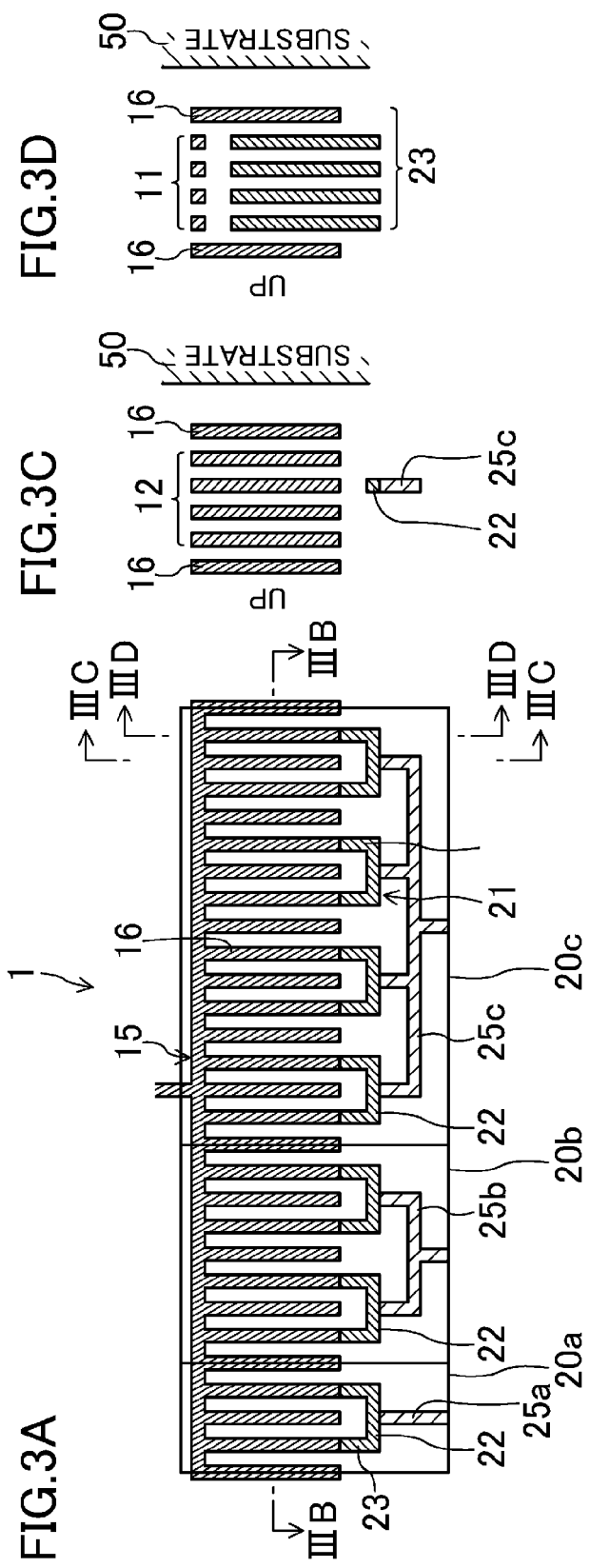

CAPACITOR ARRAY AND SIGNAL PROCESSOR INCLUDING THE ARRAY

CROSS-REFERENCE TO RELATED APPLICATION

This is a continuation of International Application No. PCT/JP2011/002735 filed on May 17, 2011, which claims priority to Japanese Patent Application No. 2010-239754 filed on Oct. 26, 2010. The entire disclosures of these applications are incorporated by reference herein.

BACKGROUND

The present disclosure relates to capacitor arrays, and layout of a plurality of comb capacitors forming a capacitor array.

Numbers of elements are arranged in a semiconductor integrated circuit, it is thus important how best to utilize limited space on a substrate. In particular, it is important how efficiently to arrange capacitive elements requiring a larger area than other elements. Thus, area-efficient comb capacitors are often used in a semiconductor integrated circuit (see, for example, U.S. Pat. No. 7,022,581).

The capacitance of a comb capacitor depends on the number of comb teeth. Various numbers of comb teeth are employed, thereby forming a capacitor array including a plurality of comb capacitors.

For example, a capacitor array shown in FIG. 7 includes three comb capacitors 100, 110, and 120. The comb capacitors 120, 110, and 100 have 1, 2, and 8 comb tooth/teeth, respectively. The comb teeth of the comb capacitors 100 and 110 are symmetrically arranged relative to the comb tooth of the comb capacitor 120, thereby averaging the tilt of the surfaces of layers of a semiconductor integrated circuit to increase the matching ratio of the comb capacitors (see, for example, U.S. Patent Publication No. 2006/0270145).

SUMMARY

For example, in FIG. 7, the capacitance ratio of the comb capacitors 120, 110, and 100 should be 1:2:8 in accordance with the number of the comb teeth. However, since the bases or coupling wires of the comb capacitors 100, 110, and 120 are arranged in parallel, slight variation occurs under the influence of parasitic capacitance among the bases and coupling wires. If the ends of comb teeth of a common electrode 130 are too close to the base or the coupling wire of the comb capacitor 100 to reduce dead space between the ends of the comb teeth and the base or the coupling wire of the comb capacitor 100, parasitic capacitance occurring therebetween increases. As a result, the matching ratio of the comb capacitors further decreases.

By contrast, in an example capacitor array, the matching ratio of comb capacitors increases.

The example capacitor array includes the plurality of comb capacitors sharing a common comb electrode. At least one of the comb capacitors has a comb electrode as a single base part. Each of the other ones of the comb capacitors has an electrode formed by coupling a plurality of base parts. In the other ones of the comb capacitors, a space between a wire coupling the base parts and an end of each of comb teeth of the common electrode, which is interposed between the base parts, is larger than a space between a base of each of the base parts of the plurality of comb capacitors and an end of each of the comb teeth of the common electrode, which is interposed between comb teeth of the base part.

With this structure, the parasitic capacitance between the base of the base part and the end of each of the comb teeth of the common electrode is the dominant parasitic capacitance in each of the comb capacitors. Such parasitic capacitance exists as much as the number of the base parts in each of the comb capacitors. This increases the matching ratio of the comb capacitors including the parasitic capacitance.

For example, the capacitor array may include a comb shield electrode. Comb teeth of the shield electrode preferably overlap comb teeth of the base parts of the plurality of comb capacitors as viewed from above. More preferably, the shield electrode includes a plurality of shield electrodes provided above and below the plurality of comb capacitors. Alternatively, the plurality of comb capacitors may be stacked one on another. In this case, the comb teeth of the common electrode and the comb teeth of the base parts of the plurality of comb capacitors may be arranged in a houndstooth check as viewed in cross-section. For example, in the capacitor array, entire surfaces of the plurality of comb capacitors may be shielded as viewed from above.

These features reduce the parasitic capacitance occurring between each adjacent pair of the comb teeth of the base parts of the different comb capacitors across the comb teeth of the common electrode.

BRIEF DESCRIPTION OF THE DRAWINGS

FIGS. 2A-2D illustrate an example layout of a capacitor array according to a first variation of the embodiment.

FIGS. 3A-3D illustrate another example layout of the capacitor array of FIGS. 2A-2D.

DETAILED DESCRIPTION

Figure 1A:
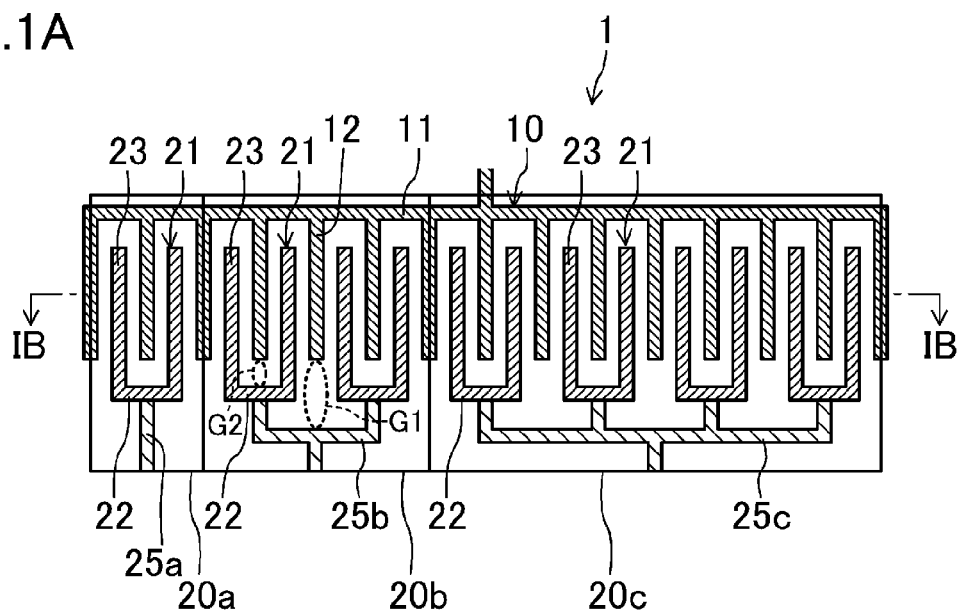
FIGS. 1A and 1B illustrate the layout of a capacitor array according to an embodiment of the present disclosure.
Figure 1B:
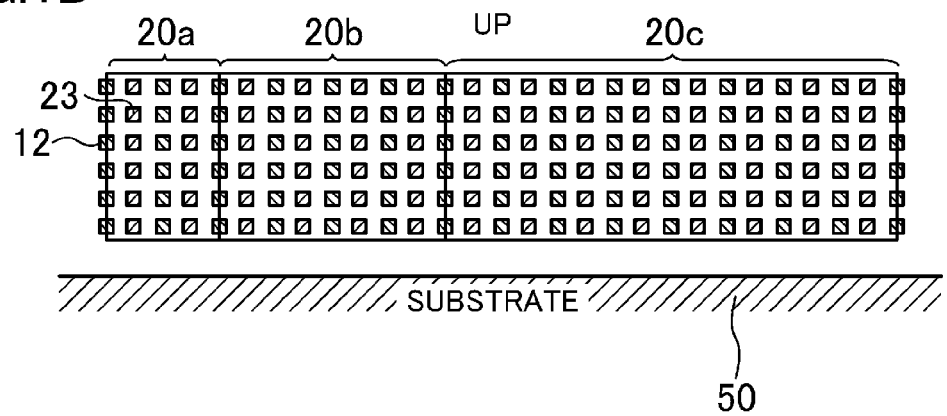

FIGS. 1A and 1B illustrate the layout of a capacitor array according to an embodiment of the present disclosure. As shown in the top view FIG. 1A, a capacitor array 1 includes comb capacitors 20a, 20b, and 20c sharing a common comb electrode 10. The common electrode 10 includes a base 11 and a plurality of comb teeth 12. Each of the comb capacitors 20a, 20b, and 20c includes a base part(s) 21, each of which is a comb electrode.

Specifically, the comb capacitor 20a is formed by alternately placing the teeth of the common electrode 10 and a single base part 21. The base part 21 includes a base 22 and, for example, two comb teeth 23. The base 22 of the base part 21 is coupled to a wire 25a.

The comb capacitor 20b is formed by alternately placing the teeth of the common electrode 10 and two base parts 21. The bases 22 of the base parts 21 are coupled by a wire 25b. In the comb capacitor 20b, a space G1 between the wire 25b and the end of each of the comb teeth 12 of the common electrode 10, which is interposed between the base parts 21, is larger than a space G2 between the base 22 of each of base parts 21 and the end of each of the comb teeth 12 of the common electrode 10, which is interposed between the comb teeth 23 of the base part 21. The space G1 may be determined, for example, in accordance with a process rule.

The comb capacitor 20c is formed by alternately placing the teeth of the common electrode 10 and four base parts 21. The bases 22 of the base parts 21 are coupled by a wire 25c. The wire 25c of the comb capacitor 20c is provided similarly to the wire 25b of the comb capacitor 20b.

FIG. 1B is a cross-sectional view taken along the line 1B-1B of FIG. 1A. As shown in FIG. 1B, the comb capacitors 20a, 20b, and 20c are multilayers, and arranged above a substrate 50. The layers of the comb capacitors 20a, 20b, and 20c are coupled by vias (not shown) in appropriate positions.

In the comb capacitors 20b and 20c, the parasitic capacitance occurring in the G1 is smaller than the parasitic capacitance occurring in the G2. The ratio of the parasitic capacitance generated in the G1 to the capacitance of the comb capacitors 20b and 20c is small and negligible. Thus, where the logic capacitance of the comb capacitor 20a is C, and the parasitic capacitance in the G2 is $\Delta C$, the actual capacitance of the comb capacitor 20b is obtained by the following equation.

$$2C+2\Delta C=2(C+\Delta C)$$

The actual capacitance of the comb capacitor 20c is as follows.

$$4C+4\Delta C=4(C+\Delta C)$$

That is, in this embodiment, the actual capacitance of the comb capacitors 20b and 20c is twice and four times the actual capacitance of the comb capacitor 20a, thereby keeping a high matching ratio of the comb capacitors. In addition, the comb capacitors 20a, 20b, and 20c are adjacent to each other, thereby reducing the parasitic capacitance between pairs of the bases 22 of the base parts 21 of the comb capacitors 20a, 20b, and 20c, and between pairs of the wires 25a, 25b, and 25c. This mitigates reduction in the matching ratio of the comb capacitors caused by the parasitic capacitance.

The number of the comb teeth 23 of the base parts 21 may be determined as appropriate. The number of the base parts 21 of the comb capacitors 20b and 20c may be also determined as appropriate. The comb capacitors 20a, 20b, and 20c are not necessarily adjacent to each other. The layers in which the wires 25a, 25b, and 25c are arranged may also be determined as appropriate.

The comb teeth 12 of the common electrode 10 may be formed line-symmetric with respect to the base 11. In this case, the comb capacitors 20a, 20b, and 20c may be arranged line-symmetric with respect to the base 11 of the common electrode 10.

In the layout shown in FIG. 1B, parasitic capacitance may occur on the surfaces of the comb capacitors 20a, 20b, and 20c between adjacent pairs of the comb capacitors 20a, 20b, and 20c across the comb teeth 12 of the common electrode 10. Thus, the comb capacitors 20a, 20b, and 20c are preferably shielded as shown in the following variations.

First Variation

FIGS. 2A-2D illustrate an example layout of a capacitor array according to a first variation of the embodiment. As shown in the top view FIG. 2A, a capacitor array 1 of this variation includes a comb shield electrode 15. Comb teeth 16 of the shield electrode 15 overlap comb teeth 23 of base parts 21 of comb capacitors 20a, 20b, and 20c. FIGS. 2B-2D are cross-sectional views taken along the lines 2B-2B, 2C-2C, and 2D-2D of FIG. 2A, respectively. As shown in FIGS. 2B-2D, the comb teeth 16 of the shield electrode 15 overlap comb teeth 12 of a common electrode 10. In the capacitor array 1 of this variation, the shield electrode 15 is preferably placed above the comb capacitors 20a, 20b, and 20c. The shield electrode 15 is coupled to the common electrode 10 by a via (not shown) in an appropriate position.

FIGS. 3A-3D illustrate another example layout of the capacitor array of FIGS. 2A-2D. The top view FIG. 3A illustrates the same structure as the top view FIG. 2A, and thus the description thereof will be omitted. FIGS. 3B-3D are cross-sectional views taken along the lines 3B-3B, 3C-3C, and 3D-3D of FIG. 3A, respectively. As shown in FIGS. 3B-3D, another shield electrode 15 is preferably provided below the comb capacitors 20a, 20b, and 20c. Where the capacitor array 1 is viewed from above, the shield electrodes 15 may be provided above or below the comb capacitor 20a, 20b, or 20c in any one of the layers.

Second Variation

Figure 4A:
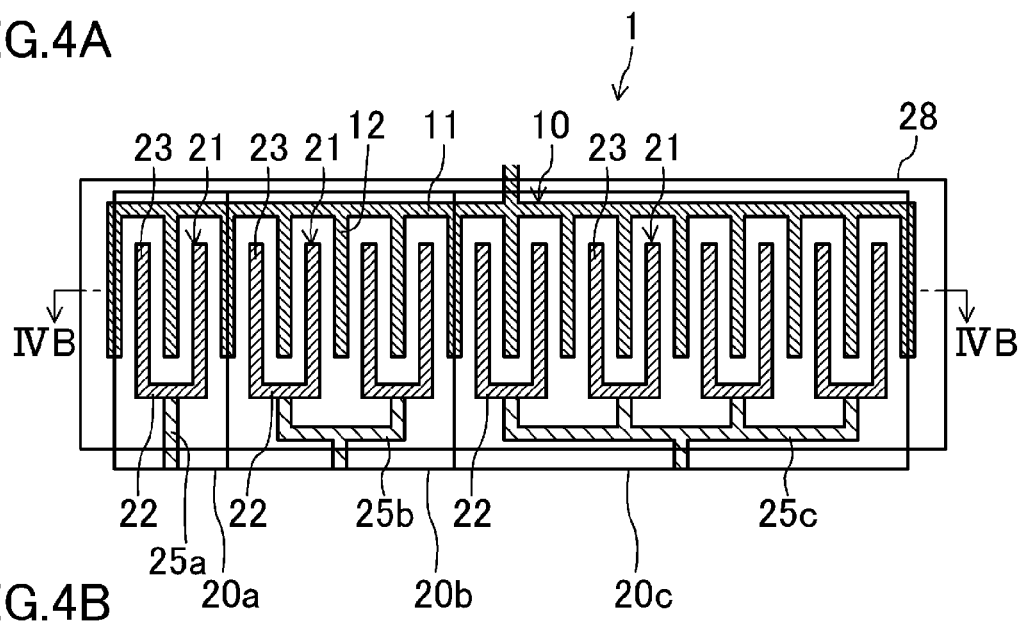
FIGS. 4A and 4B illustrate the layout of a capacitor array according to a second variation of the embodiment.
Figure 4B:
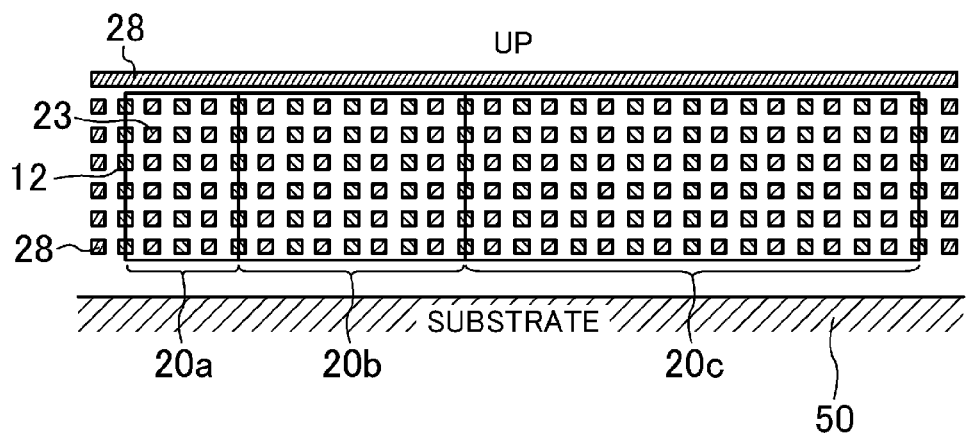

FIGS. 4A and 4B illustrate the layout of a capacitor array according to a second variation. As shown in the top view FIG. 4A, a shield member 28 shields the entire surfaces of comb capacitors 20a, 20b, and 20c. In FIG. 4A, the shield member 28 is represented only by a frame to clarify the layout of the comb capacitors 20a, 20b, and 20c, but actually, the entire region surrounded by the frame is the shield member 28. FIG. 4B is a cross-sectional view taken along the line 4B-4B of FIG. 4A. As shown in FIG. 4B, the shield member 28 preferably shields the upper surfaces of the comb capacitors 20a, 20b, and 20c and the side surfaces of a capacitor array 1. The shield member 28 may overlap part of the comb capacitors 20a, 20b, and 20c as viewed from above.

Third Variation

Figure 5A:
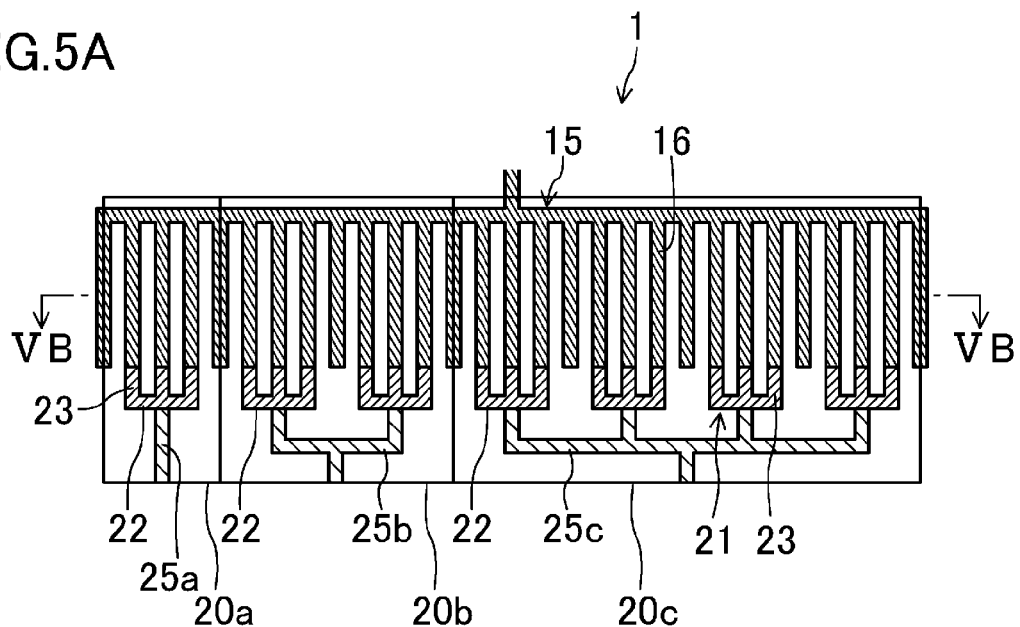
FIGS. 5A and 5B illustrate the layout of a capacitor array according to a third variation of the embodiment.
Figure 5B:
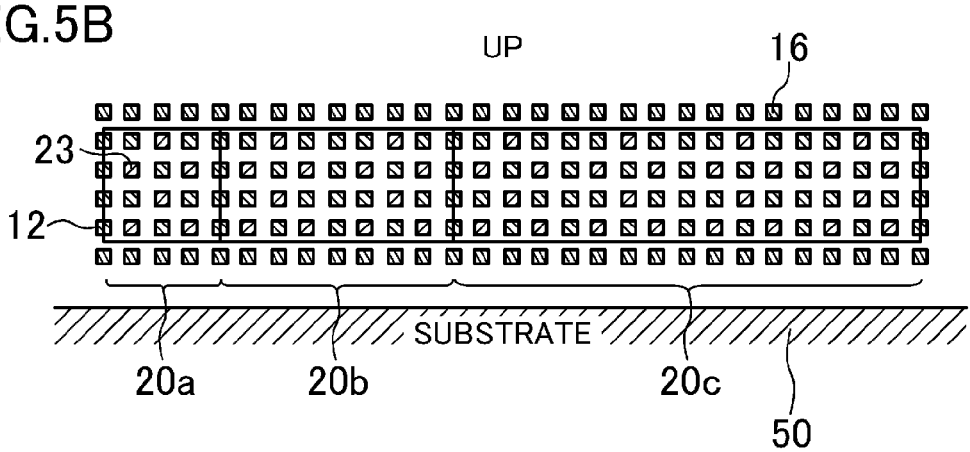

FIGS. 5A and 5B illustrate the layout of a capacitor array according to a third variation. As shown in the top view FIG. 5A, each of base parts 21 of comb capacitors 20a, 20b, and 20c has three comb teeth 23. Comb teeth 16 of a shield electrode 15 may overlap the comb teeth 23 of the base parts 21 of the comb capacitors 20a, 20b, and 20c. FIG. 5B is a cross-sectional view taken along the line 5B-5B of FIG. 5A. As shown in FIG. 5B, shield electrodes 15 are preferably provided above and below the comb capacitors 20a, 20b, and 20c. Comb teeth 12 of a common electrode 10 and the comb teeth 23 of the base parts 21 are not necessarily arranged in the same layer. The comb teeth 12 of the common electrode 10 and the comb teeth 23 of the base parts 21 may be arranged in a houndstooth check.

In the above-described variations, since the upper surfaces of the comb capacitors 20a, 20b, and 20c are shielded, parasitic capacitance is less likely to occur on the upper surfaces of the comb capacitors 20a, 20b, and 20c between pairs of the comb capacitors 20a, 20b, and 20c across the comb teeth 12 of the common electrode 10. This is also applicable to the lower surfaces of the comb capacitors 20a, 20b, and 20c. The shield shuts off disturbance noise.

While in the above-described embodiment, the comb capacitors 20a, 20b, and 20c are the multilayers, the comb capacitors 20a, 20b, and 20c shown in FIG. 1A may be arranged in one of the plurality of layers, and comb capacitors having different forms from the comb capacitors 20a, 20b, and 20c shown in FIG. 1A may be arranged in another layer. Alternatively, the comb capacitors 20a, 20b, and 20c may be single layers.

Example Application

Figure 6:
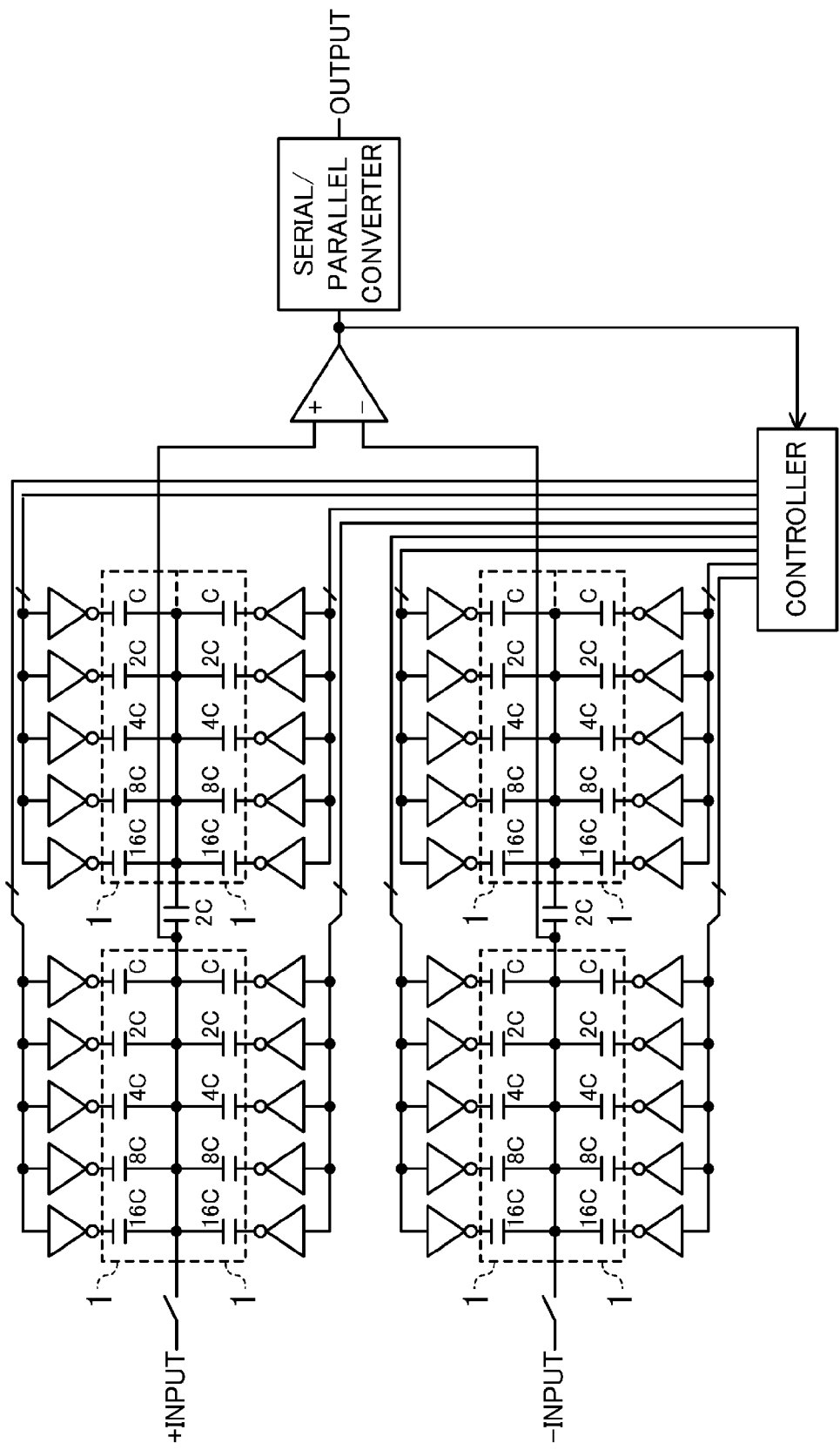
FIG. 6 is a block diagram of a successive approximation analog/digital (AD) converter including the capacitor array of FIGS. 1A and 1B.
Figure 7:
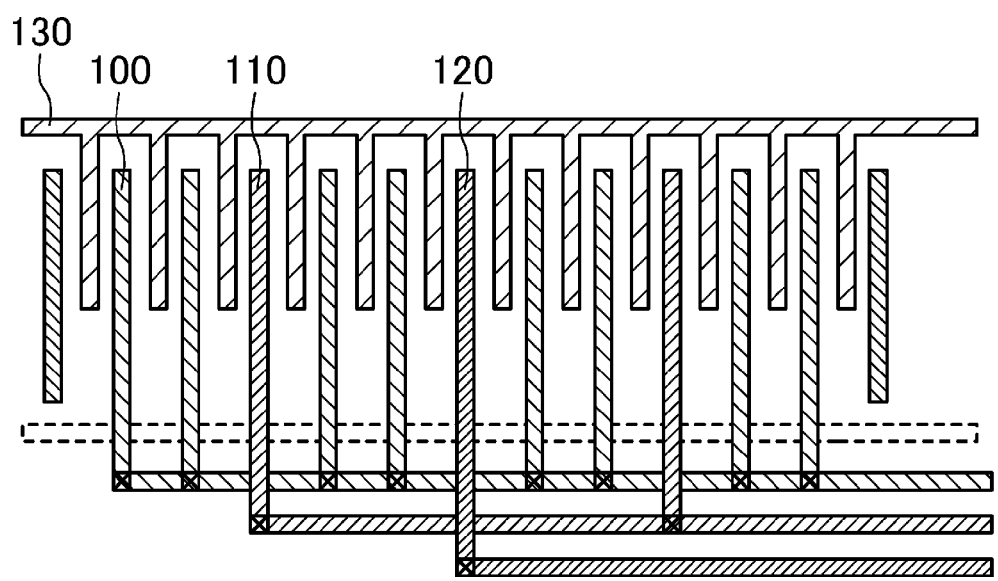
FIG. 7 is a top view of a conventional capacitor array.

FIG. 6 is a block diagram of a successive approximation AD converter as an example signal processor. For example, where binary calculation is performed with the signal processor shown in FIG. 6, capacitive elements with a power-of-two capacitance ratio are used in many cases.

The signal processor shown in FIG. 6 includes eight capacitor arrays 1 of the above-described embodiment. In each of the capacitor arrays 1, the capacitive elements, which are comb capacitors, are arranged with a capacitance ratio of 1:2:4:8:16. Adjacent two of the capacitor arrays 1 are arranged line-symmetric with respect to a wire shared by the two capacitor arrays 1. That is, the common electrode 10 shown in FIG. 1 includes a straight line extending along the length direction of the base 11 and the comb teeth 12 extending line-symmetrically. The base 11 of the common electrode 10 in such a form corresponds to a wire shared by an adjacent pair of the capacitor arrays 1.

As described above, the capacitor array 1 of the above-described embodiment is used, thereby efficiently utilizing limited circuit space and obtaining a high matching ratio.

The capacitor array 1 is also applicable to signal processors such as other types of AD converters, digital/analog (DA) converters, phase-locked loops (PLLs), and filters, other than the successive approximation AD converter.

What is claimed is:

1. A capacitor array comprising:
a plurality of comb capacitors sharing a common comb electrode, and
a comb shield electrode, wherein
at least one of the comb capacitors has a comb electrode as a single base part,
each of the other ones of the comb capacitors has an electrode formed by coupling a plurality of base parts, and
in the other ones of the comb capacitors, a space between a wire coupling the base parts and an end of each of comb teeth of the common electrode, which is interposed between the base parts, is larger than a space between a base of each of the base parts of the plurality of comb capacitors and an end of each of the comb teeth of the common electrode, which is interposed between comb teeth of the base part,
comb teeth of the shield electrode overlap comb teeth of the base parts of the plurality of comb capacitors as viewed from above, and
the shield electrode includes a plurality of shield electrodes provided above and below the plurality of comb capacitors.

2. A capacitor array comprising:
a plurality of comb capacitors sharing a common comb electrode, wherein
at least one of the comb capacitors has a comb electrode as a single base part,
each of the other ones of the comb capacitors has an electrode formed by coupling a plurality of base parts, and
in the other ones of the comb capacitors, a space between a wire coupling the base parts and an end of each of comb teeth of the common electrode, which is interposed between the base parts, is larger than a space between a base of each of the base parts of the plurality of comb capacitors and an end of each of the comb teeth of the common electrode, which is interposed between comb teeth of the base part,
the plurality of comb capacitors are stacked one on another, and
the comb teeth of the common electrode and the comb teeth of the base parts of the plurality of comb capacitors are arranged in a houndstooth check as viewed in cross-section.

3. A capacitor array comprising:
a plurality of comb capacitors sharing a common comb electrode, wherein
at least one of the comb capacitors has a comb electrode as a single base part,
each of the other ones of the comb capacitors has an electrode formed by coupling a plurality of base parts, and
in the other ones of the comb capacitors, a space between a wire coupling the base parts and an end of each of comb teeth of the common electrode, which is interposed between the base parts, is larger than a space between a base of ach of the base parts of the plurality of comb capacitors and an end of each of the comb teeth of the common electrode, which is interposed between comb teeth of the base part, and
another comb capacitor having a different form from the plurality of comb capacitors is stacked in a layer different from a layer provided with the plurality of comb capacitors.

* * * * *